United States Patent
Muza et al.

(10) Patent No.: US 9,930,451 B2
(45) Date of Patent: *Mar. 27, 2018

(54) ELIMINATION OF 3D PARASITIC EFFECTS ON MICROPHONE POWER SUPPLY REJECTION

(71) Applicant: Robert Bosch GmbH, Stuttgart (DE)

(72) Inventors: John M. Muza, Venetia, PA (US); Anthony Zisko, Pittsburgh, PA (US)

(73) Assignee: Robert Bosch GmbH, Stuttgart (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/355,350

(22) Filed: Nov. 18, 2016

(65) Prior Publication Data
US 2017/0070816 A1   Mar. 9, 2017

Related U.S. Application Data

(63) Continuation of application No. 14/449,709, filed on Aug. 1, 2014, now Pat. No. 9,502,019.

(Continued)

(51) Int. Cl.
*H04B 15/00* (2006.01)
*H04R 3/00* (2006.01)
(Continued)

(52) U.S. Cl.
CPC ........... *H04R 3/007* (2013.01); *G10K 11/002* (2013.01); *H03G 11/00* (2013.01); *H04R 3/00* (2013.01);
(Continued)

(58) Field of Classification Search
None
See application file for complete search history.

(56) References Cited

U.S. PATENT DOCUMENTS 7,622,994 B2   11/2009   Galal
8,374,363 B2    2/2013   Onishi
(Continued)

FOREIGN PATENT DOCUMENTS

EP   2270979   1/2011

OTHER PUBLICATIONS

International Search Report and Written Opinion for Application No. PCT/US2014/071202 dated Mar. 10, 2015 (11 pages).
(Continued)

*Primary Examiner* — Joseph Saunders, Jr.
*Assistant Examiner* — James Mooney
(74) *Attorney, Agent, or Firm* — Michael Best & Friedrich LLP

(57) ABSTRACT

Systems and methods are presented for power supply noise cancellation in a microphone package. A first node on a MEMS microphone package is coupled to an inverted voltage signal of a power supply output. A summing node is connected to both the first node and a second node. The second node is coupled to a non-inverted voltage signal of the power supply output. Because the parasitic capacitance of the MEMS microphone package is substantially equivalent relative to both the first node and the second node, the summing node outputs a noise-reduced summed voltage signal. An adjustable trim module is coupled to the first node and configured to adjust a reduction of a power supply noise in the summed voltage signal from the summing node.

16 Claims, 5 Drawing Sheets

Related U.S. Application Data

(60) Provisional application No. 61/937,711, filed on Feb. 10, 2014.

(51) Int. Cl.

| | | |
|---|---|---|
| *G10K 11/00* | (2006.01) | |
| *H04R 23/00* | (2006.01) | |
| *H04R 19/00* | (2006.01) | |
| *H03G 11/00* | (2006.01) | |
| *H04R 1/04* | (2006.01) | |

(52) U.S. Cl.
CPC .......... *H04R 19/005* (2013.01); *H04R 23/00* (2013.01); *H04R 1/04* (2013.01); *H04R 2201/003* (2013.01); *H04R 2410/05* (2013.01)

(56) References Cited

U.S. PATENT DOCUMENTS

| | | |
|---|---|---|
| 2003/0094932 A1 | 5/2003 | Knoedgen |
| 2007/0170976 A1 | 7/2007 | Saman |
| 2010/0254544 A1 | 10/2010 | Kimura et al. |
| 2011/0255228 A1 | 10/2011 | Kimura et al. |
| 2012/0076322 A1 | 3/2012 | Kimura et al. |
| 2012/0121106 A1* | 5/2012 | Henriksen ............ H03F 1/3211 381/94.1 |
| 2013/0015919 A1 | 1/2013 | Kropfitsch et al. |
| 2013/0271307 A1 | 10/2013 | Kropfitsch et al. |

OTHER PUBLICATIONS

Andrea Barbieri et al: "100 + dB A-Weighted SNR Microphone Preamplifier With On-Chip Decoupling Capacitors" IEEE Journal of Solid-State Circuits, IEEE Service Center, Piscataway, NJ, USA, vol. 17, No. 11, Nov. 1, 2012. pp. 2737-2750.

* cited by examiner

ELIMINATION OF 3D PARASITIC EFFECTS ON MICROPHONE POWER SUPPLY REJECTION

RELATED APPLICATIONS

This application is a continuation of U.S. patent application Ser. No. 14/4490,709, filed Aug. 1, 2014, which claims the benefit of U.S. Provisional Patent Application No. 61/937,711, filed on Feb. 10, 2014, the entire contents of both of which are incorporated herein by reference.

BACKGROUND

The present invention relates to microphone systems and methods for reducing signal noise caused by the power supply of the microphone system.

SUMMARY

In some embodiments, the invention provides a technique for eliminating the effect of power supply noise coupling to the high impedance preamplifier input due to packaging parasitic capacitors. The technique creates an inversion of the power supply noise and couples it back into the preamplifier input, which will reduce or even cancel the effects of the packaging parasitic supply noise coupling.

In some embodiments, the invention provides a microphone system that is not limited in Power Supply Rejection Ratio (PSRR) performance due to packaging parasitic capacitors. The best achievable PSRR in a system without this technique would be determined by the capacitive divider set by the packaging parasitic and the MEMS sensor. Therefore, with this technique we can allow the PSRR to be dominated by circuit performance instead of the packaging environment, which should allow for much greater supply noise rejection.

In one embodiment, the invention provides a microphone system including a MEMS microphone package and a power supply external to the MEMS microphone package. The MEMS microphone package includes a first node and a second node having nearly equivalent 3D parasitic capacitances relative to a preamplifier of the microphone package, such that any noise generated on the first node is reduced or cancelled by any noise generated on the second node at the preamplifier input The power supply is connected to the first node and provides a bias voltage signal to the MEMS microphone package via the first node. The microphone system also includes an inverting amplifier inside the MEMS microphone package and located on an application specific integrated circuit (ASIC). The inverting amplifier is connected between the power supply and the second node. The inverting amplifier provides an inverted voltage signal to the preamplifier of the MEMS microphone package via the second node. A third node located inside the MEMS microphone package is connected to both the first node and the second node via parasitic capacitors such that noise on the bias voltage signal is reduced or cancelled by corresponding noise on the inverted voltage signal. The noise-reduced bias voltage signal from the third node is applied to a microphone. The microphone provides an output signal to a preamplifier positioned within the MEMS microphone package.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
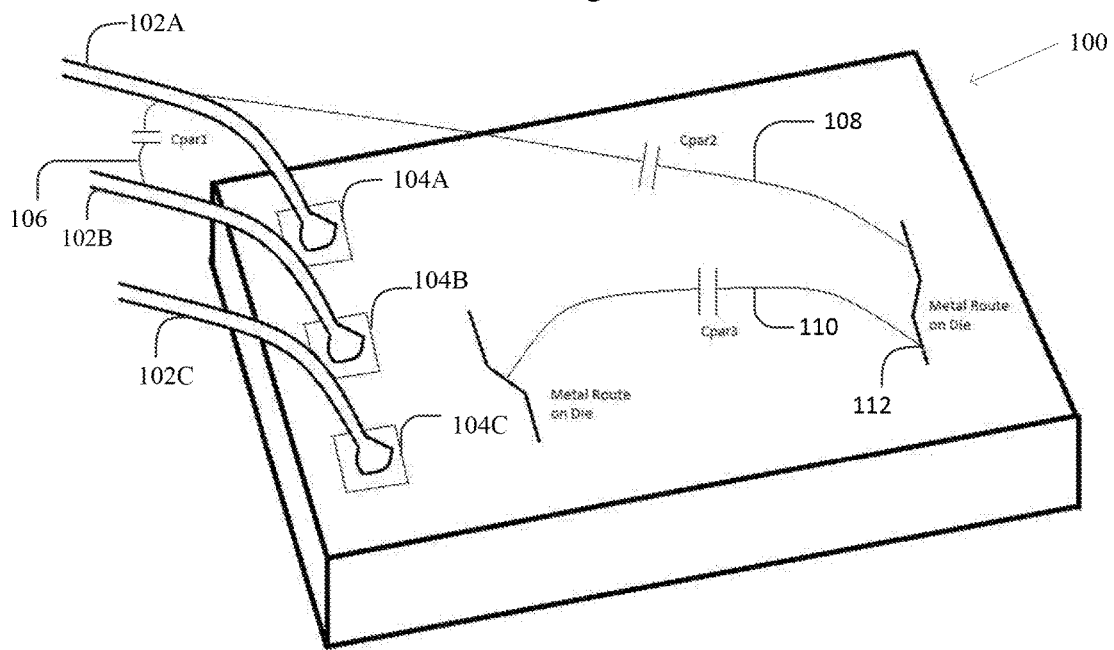
FIG. 1 is a perspective view of a microphone die package according to one embodiment.

FIG. 1 illustrates 3D parasitic capacitances that exist both within and external to a die 100 that contains an integrated circuit of a microphone. The die 100 is connected to bond wires, which provide power (bond wire 102A), ground (bond wire 102B), and input/output signals (bond wire 102C). The proximity of the bond wires 102A, 102B, 102C to each other creates parasitic capacitance 106 between the bond wires 102A, 102B, 102C. The parasitic capacitance 106 can also arise from the solder joints that connect the bond wires 102A, 102B, 102C to the connection pads 104A, 104B, 104C, respectively. In addition to the parasitic capacitance 106 between the bond wires 102A, 102B, 102C, parasitic capacitance 108 arises between the bond wires 102A, 102B, 102C (and the connection pads 104A, 104B, 104C) and the metal routes 112 on the die 100. Additional parasitic capacitance 110 arises between the various metal routes 112 on the die 100.

Figure 2:
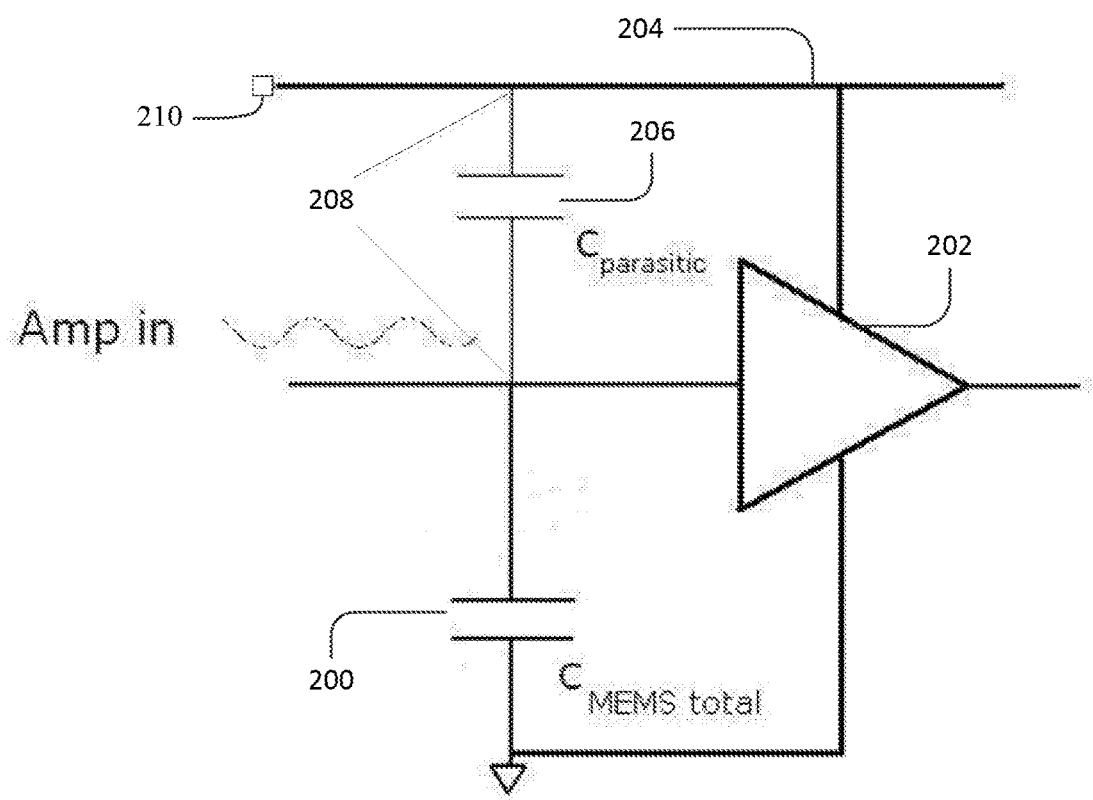
FIG. 2 is a circuit diagram illustrating the electronic effect of power supply noise coupling into an amplifier in the microphone system of FIG. 1.

FIG. 2 illustrates the electronic effect that the 3D parasitic capacitances (as described in FIG. 1) have on the quality of a microphone output signal. A first terminal of a capacitive microphone 200 is connected directly to an input of a preamplifier 202. The other terminal of the capacitive microphone 200 is connected to ground. A power supply line 204 supplies power (e.g., a biasing voltage for the capacitive microphone 200) to node 210. The location of the power supply 204 creates capacitive coupling 206 between circuit nodes 208. In some embodiments, pad 210 is one or more of connection pads 104A, 104B, 104C and has one or more solder balls securing bond wires to the chip. The capacitive coupling 206 produces unwanted noise at the input of the preamplifier 208. Additional capacitive coupling, as shown by FIG. 1, creates unwanted signals to couple directly into the preamplifier 208.

By design, the input of the preamplifier 202 where the microphone 200 is connected is very high impedance, which means that unwanted noise from the power supply line 204 couples into this node and has a magnitude determined by the total 3D parasitic capacitance. This magnitude directly influences the total achievable Power Supply Rejection Ratio, or PSRR, that the circuit can achieve. In order to achieve a high PSRR that is not limited by the package parasitic capacitances into this node, the effect of the power supply noise coupling needs to be mitigated.

Figure 3:
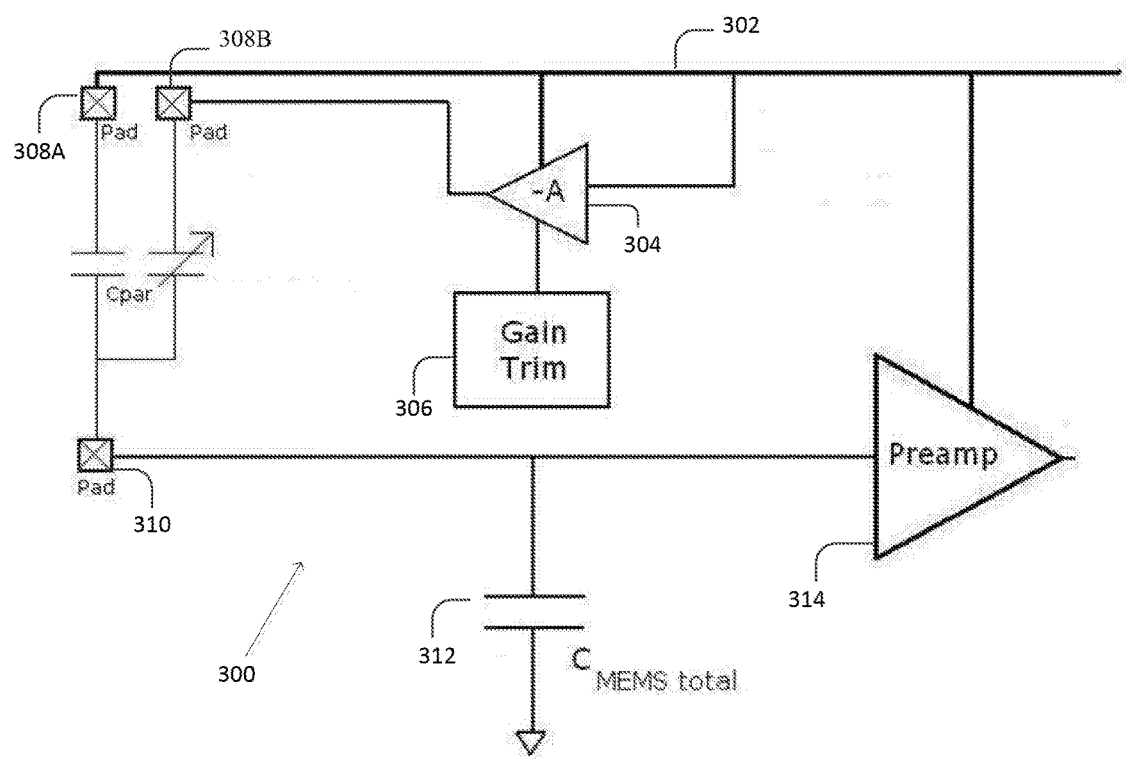
FIG. 3 is a circuit diagram of a power supply noise rejection system for the microphone system of FIG. 1.

FIG. 3 illustrates an embodiment of a microphone system 300 that improves the achievable PSRR. The system includes an inverting amplifier 304 that creates an inverted duplicate of the power supply signal 302. A gain trim module 306 allows the magnitude of the inverted signal to be adjusted. The power supply signal 302 and the trimmed, inverted signal are each coupled by a solder ball to separate pads 308A, 308B located approximately the same distance from the preamplifier 314 input. The pads 308 couple to a connection node 310 on the interior of the microphone package via parasitic capacitors such that a capacitive divider is formed. The coupling capacitance is nearly identical for the power supply signal 302 and the inverted signal from the inverting amplifier 304. Thus, any noise generated from the power supply sees a nearly equivalent transfer function to the preamplifier input as the inverting amplifier output to the preamplifier input. As a result, the noise present in both the primary signal and the inverted signal are reduced or cancelled at the pre-amplifier 314 input. This reduction or cancellation of the noise component of the supply voltage signal 302 at the preamplifier input results in a higher PSRR for the microphone system 300.

In other embodiments, the equivalent coupling capacitance needed to match the 3D parasitic capacitance can be generated in other ways. Another method is to route the output of the inverting amplifier on the die such that it creates a capacitance that matches the parasitic capacitance of the voltage supply signal. Additionally, the coupling capacitors can be adjusted to change the amplitude of the inverted signal instead of, or in combination with, the inverting amplifier.

The schematic diagram in FIG. 3, illustrates the architecture of one embodiment that allows the PSRR to be adjusted at final device testing. It should be understood that in other constructions the PSRR could be adjusted post manufacture. In such an embodiment, a microprocessor and memory module could perform the gain trim adjustments episodically, for example on every power-up of the device.

Figure 4:
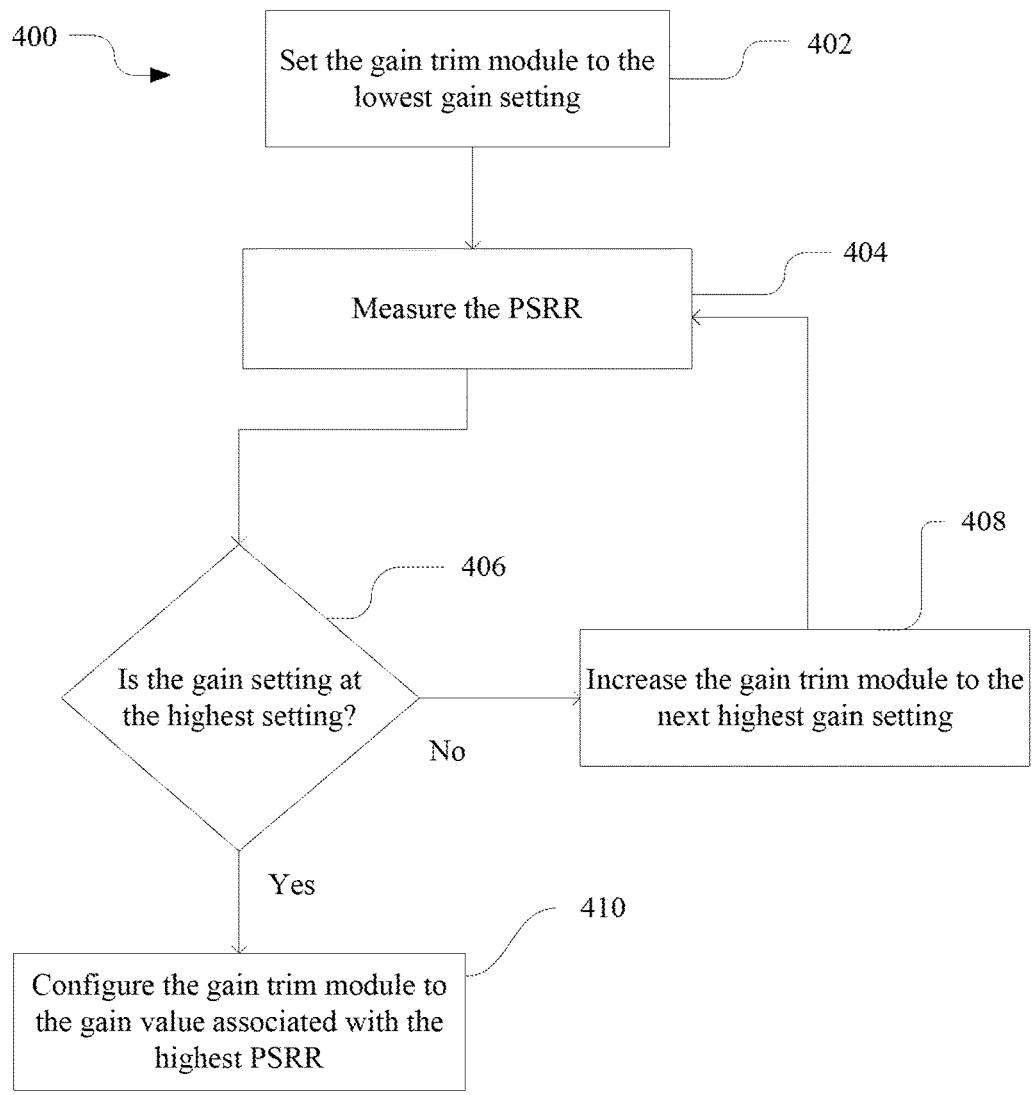
FIG. 4 is a flowchart illustrating a method for setting the gain trim module for use by the power supply noise rejection system of FIG. 3.

In one embodiment, the gain trim module 206 is adjusted manually using transistor level switches. FIG. 4 illustrates on such method 400. The tester (either an automated test system or a user) sets the gain trim module 206 to the lowest gain setting (step 402). The tester then measures the PSRR with an external device (step 404). As long as there is a higher available gain setting (step 406), the tester continues to adjust the gain setting to the next highest gain settings (step 408) while measuring the PSRR at each gain setting (step 404). When the PSRR value for every gain setting has been measured 410, the tester sets the gain trim module to the gain value associated with the highest measured PSRR value (step 410).

The parameters which will determine the gain setting needed for maximum PSRR in the microphone will not typically change appreciably with time. Therefore, performing this test once during final device testing may be sufficient. In embodiments where the calibration is performed only once, the gain setting is set through transistor level switches within the microphone system.

Figure 5:
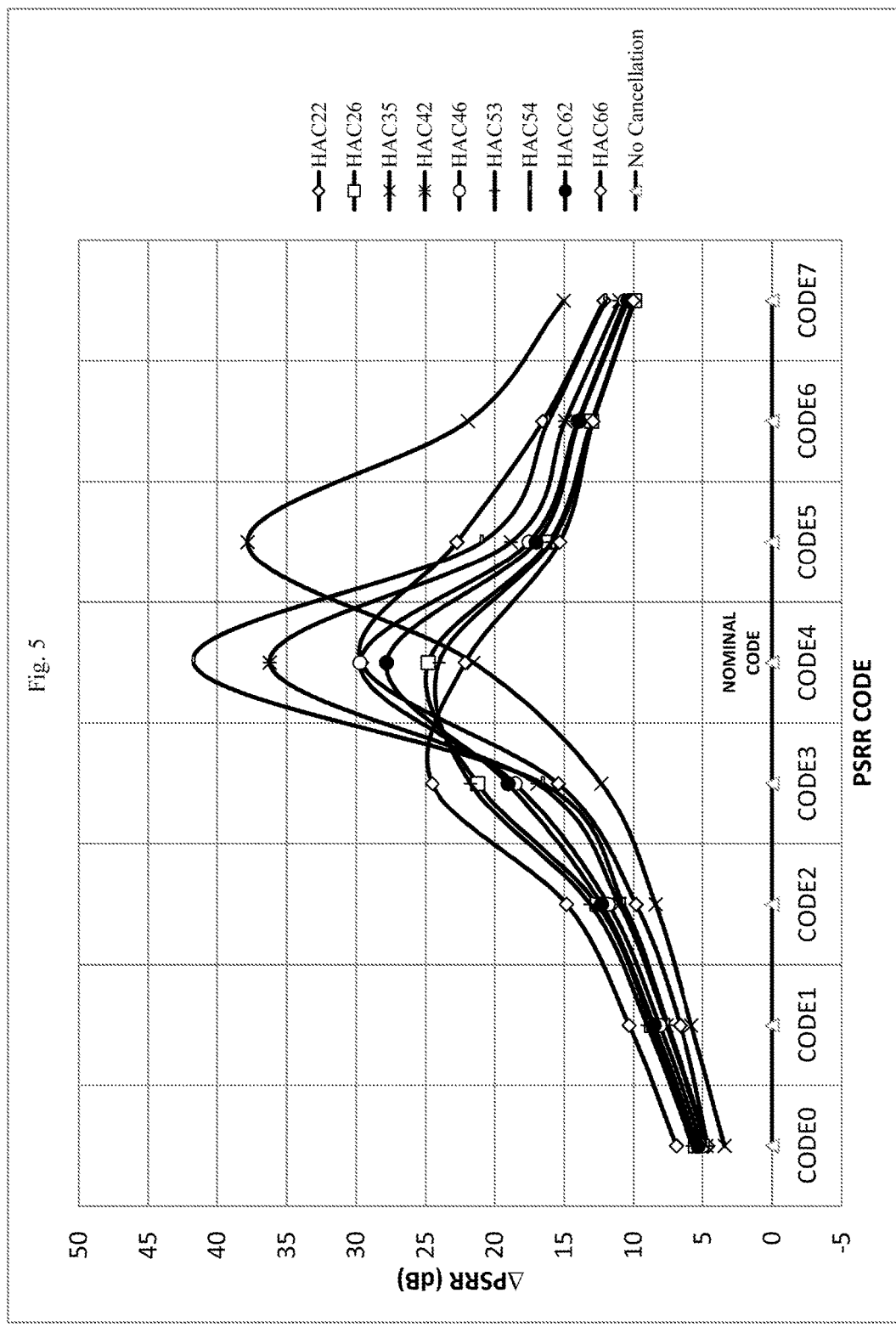
FIG. 5 is a graph of Power Supply Rejection Ratios as a function of gain for various microphone system packages.

FIG. 5 illustrates an example of PSRR values for increasing trim gain settings for a series of microphone packages (HAC22, HAC26, HAC35, HAC42, HAC46, HAC53, HAC54, HAC62, HAC66) using the method of FIG. 4. On the vertical axis, the change in PSSR is displayed in decibels. On the horizontal axis, gain trim codes for the inverting amplifier 304 are displayed from lowest to highest. The gain trim codes represent successive steps for transistor level switches with each number representing an increase in gain for the inverting amplifier 304. The curves in the body of the plot each represent a characteristic curve for a different microphone design. These curves are normalized to a PSRR value of zero without any noise cancellation. A flat line at the bottom of the plot shows a microphone that does not use the noise cancellation of the system in FIG. 3.

For each of the microphone devices, a single gain setting is identified that achieves the highest change in PSRR. For HAC66, the optimal gain setting is 4. For HAC35, the optimal gain setting is 6. For all other microphone systems illustrated in FIG. 5, the optimal gain setting for providing the best power supply noise cancelling is gain setting 5.

Thus, the invention provides, among other things, a microphone system capable of improved power supply noise cancellation and a method of adjusting a gain setting of an inverting amplifier of such a microphone system to achieve an optimal power supply noise rejection setting. Various features and advantages are set forth in the following claims.

What is claimed is:

1. A power supply noise cancellation system for a microphone package comprising:
   a first node on a MEMS microphone package coupled to an inverted voltage signal of a power supply output;
   a summing node connected to both the first node and a second node, the second node being coupled to a non-inverted voltage signal of the power supply output, and outputting a noise-reduced summed voltage signal, wherein a parasitic capacitance of the MEMS microphone package is substantially equivalent relative to both the first node and the second node; and
   an adjustable trim module coupled to the first node and configured to adjust a reduction of a power supply noise in the summed voltage signal from the summing node.

2. The power supply noise cancellation system of claim 1, wherein the adjustable trim module includes an adjustable capacitor coupled between the first node and the summing node, wherein an adjustment of a capacitance of the adjustable capacitor, based at least in part on a parasitic capacitance of the MEMS microphone package relative to an external power supply, causes a corresponding adjustment to the reduction of the power supply noise in the summed voltage signal from the summing node.

3. The power supply noise cancellation system of claim 2, wherein the adjustable trim module further includes a controller configured to adjust the capacitance of the adjustable capacitor based at least in part on the parasitic capacitance of the MEMS microphone package relative to the external power supply.

4. The power supply noise cancellation system of claim 1, wherein the adjustable trim module includes a gain-adjustable inverting amplifier coupled between an external power supply and the first node, wherein an adjustment of a gain of the gain-adjustable inverting amplifier, based at least in part on a parasitic capacitance of the MEMS microphone package relative to the external power supply, causes a corresponding adjustment to the reduction of the power supply noise in the summed voltage signal from the summing node.

5. The power supply noise cancellation system of claim 4, wherein the adjustable trim module further includes a controller configured to adjust the gain of the gain-adjustable inverting amplifier based at least in part on the parasitic capacitance of the MEMS microphone package relative to the external power supply.

6. The power supply noise cancellation system of claim 4, further comprising one or more level switches, wherein the gain of the inverting amplifier is adjusted manually using the one or more level switches.

7. The power supply noise cancellation system of claim 4, further comprising a microprocessor configured to
set the inverting amplifier to a first gain setting,
determine a power supply rejection ratio at the first gain setting,
adjust the inverting amplifier to a second gain setting,
determine a power supply rejection ratio at the second gain setting,
compare the power supply rejection ratio at the first gain setting to the power supply rejection ratio at the second gain setting; and
operate the microphone package at the first gain setting when the power supply rejection ratio at the first gain setting is greater than the power supply rejection ratio at the second gain setting.

8. The power supply noise cancellation system of claim 4, further comprising a microprocessor configured to determine a power supply rejection ratio at each of a plurality of gain settings and to identify an optimal gain setting based on the determined power supply rejection ratio at each gain setting.

9. The power supply noise cancellation system of claim 1, wherein the first node includes an external pad connection for a solder joint.

10. A power supply noise cancellation system for a microphone package comprising:
a first node on a MEMS microphone package coupled to an inverted voltage signal of a power supply output;
a summing node connected to both the first node and a second node, the second node being coupled to a non-inverted voltage signal of the power supply output, and outputting a noise-reduced summed voltage signal, wherein a parasitic capacitance of the MEMS microphone package is substantially equivalent relative to both the first node and the second node; and
an adjustable capacitor coupled between the first node and the summing node, wherein an adjustment of a capacitance of the adjustable capacitor, based at least in part on a parasitic capacitance of the MEMS microphone package relative to an external power supply, causes a corresponding adjustment to a reduction of a power supply noise in the summed voltage signal from the summing node.

11. A power supply noise cancellation system for a microphone package comprising:
a first node on a MEMS microphone package coupled to an inverted voltage signal of a power supply output;
a summing node connected to both the first node and a second node, the second node being coupled to a non-inverted voltage signal of the power supply output; and
a gain-adjustable inverting amplifier coupled between an external power supply and the first node, wherein an adjustment of a gain of the gain-adjustable inverting amplifier, based at least in part on a parasitic capacitance of the MEMs microphone package relative to the external power supply, causes a corresponding adjustment to a reduction of a power supply noise in the summed voltage signal from the summing node.

12. A method of adjusting a power supply noise reduction of a microphone package, the microphone package including a first node coupled to a voltage signal from an external power supply, a second node coupled to an inverted voltage signal from the external power supply, wherein a parasitic capacitance of the microphone package is substantially equivalent relative to both the first node and the second node, the method comprising:
applying a first trim setting to a trim module coupled to the first node;
measuring a power supply rejection ratio while using the first trim setting;
applying a second trim setting to the trim module;
measuring the power supply rejection ratio while using the second trim setting; and
identifying a trim setting that generates a highest power supply rejection ratio.

13. The method of claim 12, wherein applying the first trim setting to the trim module coupled to the first node includes applying a first capacitance setting to an adjustable capacitor coupled between the first node and the summing node, and wherein applying the second trim setting to the trim module coupled to the first node includes applying a second capacitance setting to the adjustable capacitor coupled between the first node and the summing node.

14. The method of claim 13, wherein adjusting a capacitance setting of the adjustable capacitor causes a corresponding adjustment to the reduction of the power supply noise in the summed voltage signal from the summing node.

15. The method of claim 12, wherein applying the first trim setting to the trim module coupled to the first node includes applying a first gain setting to a gain-adjustable inverting amplifier coupled between an external power supply and the first node, and wherein applying the second trim setting to the trim module coupled to the first node includes applying a second gain setting to the gain-adjustable inverting amplifier coupled between the first node and the summing node.

16. The method of claim 15, wherein adjusting a gain setting of the gain-adjustable inverting amplifier causes a corresponding adjustment to the reduction of the power supply noise in the summed voltage signal from the summing node.

* * * * *